(12) United States Patent
Miyamoto et al.

(10) Patent No.: US 8,544,828 B2
(45) Date of Patent: Oct. 1, 2013

(54) LIQUID MATERIAL VAPORIZATION APPARATUS

(75) Inventors: Hideaki Miyamoto, Kyoto (JP); Ichiro Nishikawa, Kyoto (JP)

(73) Assignee: Horiba STEC, Co., Ltd., Kyoto-shi (JP)

( * ) Notice: Subject to any disclaimer, the term of this patent is extended or adjusted under 35 U.S.C. 154(b) by 471 days.

(21) Appl. No.: 12/809,051

(22) PCT Filed: Dec. 5, 2008

(86) PCT No.: PCT/JP2008/072153
§ 371 (c)(1),
(2), (4) Date: Jun. 17, 2010

(87) PCT Pub. No.: WO2009/078293
PCT Pub. Date: Jun. 25, 2009

(65) Prior Publication Data
US 2011/0115104 A1     May 19, 2011

(30) Foreign Application Priority Data

Dec. 19, 2007    (JP) .................................. 2007-326748

(51) Int. Cl.
*B01F 3/04*      (2006.01)

(52) U.S. Cl.
USPC ........................ 261/63; 261/DIG. 65; 118/726

(58) Field of Classification Search
USPC .................. 261/54, 62, 63, 76, 142, DIG. 65; 118/726
See application file for complete search history.

(56) References Cited

U.S. PATENT DOCUMENTS

| | | | |
|---|---|---|---|
| 5,419,924 A * | 5/1995 | Nagashima et al. | 427/248.1 |
| 6,224,681 B1 * | 5/2001 | Sivaramakrishnan et al. | 118/726 |
| 6,752,387 B1 * | 6/2004 | Nishizato et al. | 261/62 |
| 7,332,040 B1 * | 2/2008 | Kojima et al. | 118/726 |
| 7,975,993 B2 * | 7/2011 | Ono | 261/154 |

FOREIGN PATENT DOCUMENTS

| | | |
|---|---|---|
| CN | 101006197 A | 7/2007 |
| JP | 6220641 | 8/1994 |
| JP | 11106921 | 4/1999 |
| JP | 2000334005 A | 5/2000 |
| JP | 2001156055 | 6/2001 |
| JP | 2003273025 | 9/2003 |
| JP | 2004031441 | 1/2004 |

OTHER PUBLICATIONS

ISA Japan, International Search Report of PCT/JP2008/072153, Feb. 17, 2009, 2 pages.

* cited by examiner

*Primary Examiner* — Charles Bushey
(74) *Attorney, Agent, or Firm* — Alleman Hall McCoy Russell & Tuttle, LLP

(57) ABSTRACT

An object of this invention is to provide a liquid material vaporization apparatus that is capable of increasing the flow rate of a carrier gas without changing the shape of a nozzle. The liquid material vaporization apparatus comprises a gas-liquid mixing chamber in which a liquid material and the carrier gas are mixed, a liquid material introduction path that introduces the liquid material into the gas-liquid mixing chamber, a carrier gas introduction path that introduces the carrier gas into the gas-liquid mixing chamber, a vaporization nozzle section that is communicated with the gas-liquid mixing chamber to subject a mixture of the liquid material and the carrier gas to flash boiling, and a mixed gas derivation path that is communicated with the vaporization nozzle section to derive the mixed gas vaporized by the vaporization nozzle section.

4 Claims, 7 Drawing Sheets

| NOZZLE DIAMETER | FLOW RATE | BYPASS DIAMETER | FLOW RATE |
|---|---|---|---|
| 0.2 | Q | 0.2 | Q |
| 0.4 | 4 × Q | 0.4 | 4 × Q |
| 0.6 | 9 × Q | 0.6 | 9 × Q |
| 0.8 | 16 × Q | 0.8 | 16 × Q |
| 1.0 | 25 × Q | 1.0 | 25 × Q |

FIG.4

LIQUID MATERIAL VAPORIZATION APPARATUS

FIELD OF THE ART

This invention relates to a liquid material vaporization apparatus that vaporizes various liquid materials used for, for example, semiconductor manufacture.

BACKGROUND ART

As shown in, for example, the patent document 1, a conventional liquid material vaporization apparatus comprises a main body block heated by a heater, inside of which arranged are a gas-liquid mixing section where a liquid material and a carrier gas are mixed, a liquid material introduction path to introduce the liquid material into the gas-liquid mixing section, a carrier gas introduction path to introduce the carrier gas into the gas-liquid mixing section, a vaporization nozzle section to subject a mixture of the liquid material and the carrier gas to flash boiling, and a mixed gas derivation path to derive the mixed gas vaporized by the vaporization nozzle section.

Since a flow rate of the carrier gas directly affects a partial pressure of the liquid material in the mixture, the flow rate of the carrier gas is an important factor to determine a vaporized amount of the liquid material.

However, in the arrangement of the above-mentioned conventional liquid material vaporization apparatus, all of the introduced carrier gas passes the vaporization nozzle section. With this arrangement, there is a problem in that a pressure loss of the carrier gas in the vaporization nozzle section becomes big so that the flow rate of the carrier gas is restricted. As a result, there is a problem in that the vaporized amount of the liquid material is restricted.

In addition, it can be simply conceived that a nozzle shape (a nozzle diameter) of the vaporization nozzle section is changed so as to increase the flow rate of the carrier gas, however, there is a problem in that the nozzle shape is difficult to change because the nozzle shape largely affects the vaporization efficiency.

Patent document 1: Japan patent laid-open number 2004-31441

DISCLOSURE OF THE INVENTION

Problems to be Solved by the Invention

The present claimed invention intends to solve all of the problems and a main object of this invention is to make it possible to increase the flow rate of the carrier gas without changing the nozzle shape.

Means to Solve the Problems

More specifically, the liquid material vaporization apparatus in accordance with this invention is characterized by comprising a gas-liquid mixing section in which a liquid material and a carrier gas are mixed, a liquid material introduction path that introduces the liquid material into the gas-liquid mixing section, a carrier gas introduction path that introduces the carrier gas into the gas-liquid mixing section, a vaporization nozzle section that is communicated with the gas-liquid mixing section to subject a mixture of the liquid material and the carrier gas to flash boiling, a mixed gas derivation path that is communicated with the vaporization nozzle section to derive the mixed gas vaporized by the vaporization nozzle section, and a bypass path through which the carrier gas introduction path is communicated with the mixed gas derivation path and that flows the carrier gas from the carrier gas introduction path to the mixed gas derivation path.

In accordance with this arrangement, since not all of the carrier gas flowing in the carrier gas introduction path passes the nozzle section but a part of the carrier gas passes the bypass path and flows into the mixed gas derivation path, it is possible to increase a flow rate of the carrier gas without changing the nozzle shape of the vaporization nozzle section. As a result, it is possible to reduce a partial pressure of the liquid material so that a vaporized amount of the liquid material can be increased.

In addition, it is preferable that an opening of the bypass path in the mixed gas derivation path is arranged near a downstream side opening of the vaporization nozzle section. With this arrangement, the carrier gas from the bypass path collides with the mixture passing through the vaporization nozzle section, thereby enabling further promotion of vaporization of the mixture.

In order to improve versatility of the apparatus, it is preferable that an open and close mechanism that opens and closes the bypass path is provided.

In order to further improve versatility of the apparatus and to make it possible to adjust the flow rate of the carrier gas according to a vaporization condition of the liquid material, it is preferable that a flow rate control mechanism that controls a flow rate of the carrier gas flowing in the bypass path is provided.

Effect of the Invention

In accordance with this invention, it is possible to increase a flow rate of the carrier gas without changing a shape of the nozzle.

BRIEF DESCRIPTION OF THE DRAWINGS

FIG. 4 is a view showing a relationship between a diameter of the bypass path and a flow rate.

EXPLANATION OF THE CODE

Figure 1:
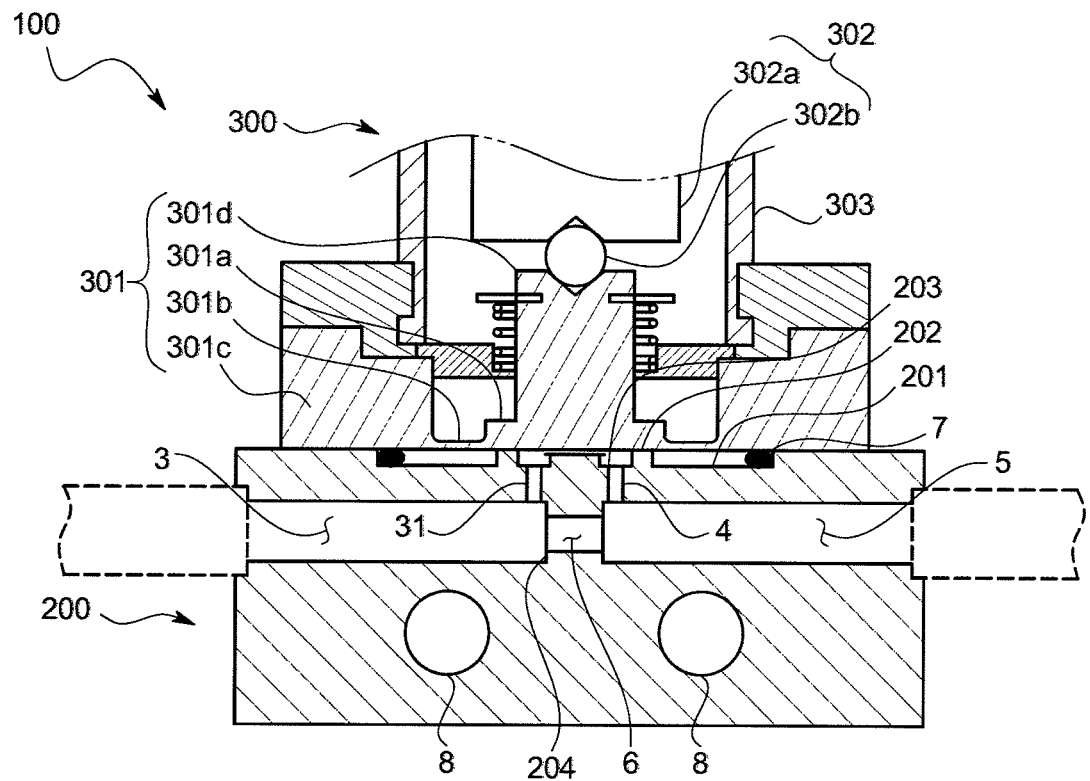
FIG. 1 is a cross-sectional view of a liquid material vaporization apparatus in accordance with a first embodiment of this invention.

100 . . . liquid material vaporization apparatus
LM . . . liquid material
CG . . . carrier gas
MG . . . mixed gas
1 . . . vapor-liquid mixing chamber
2 . . . liquid material introduction path
3 . . . carrier gas introduction path 4 . . . vaporization nozzle section
5 . . . mixed gas derivation path
6 . . . bypass path
9 . . . flow rate control section (opening and closing mechanism, flow rate control mechanism)

BEST MODES OF EMBODYING THE INVENTION

First Embodiment

Figure 2:
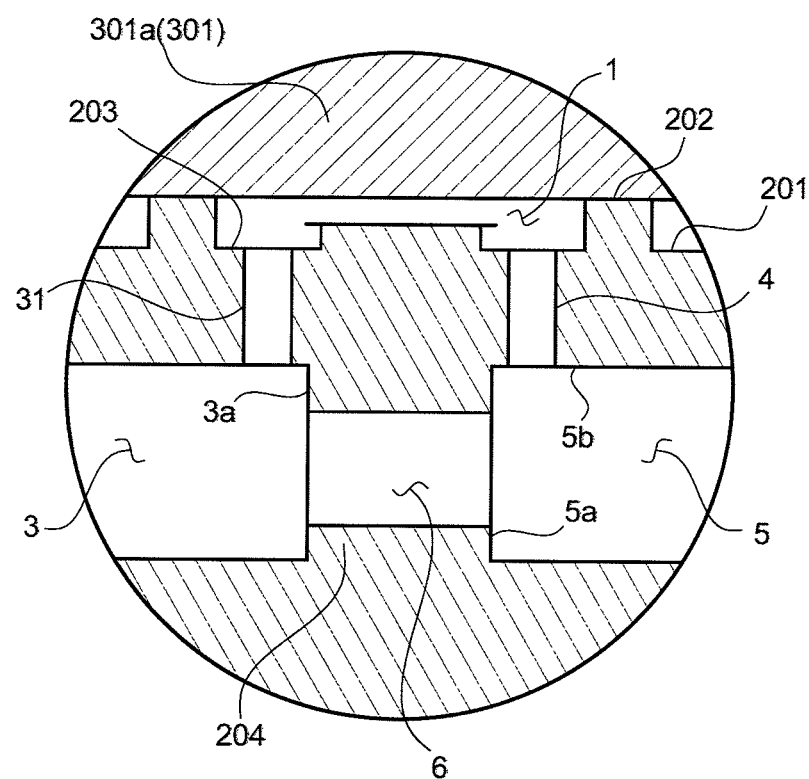
FIG. 2 is a partial enlarged cross-sectional view mainly showing a vaporization nozzle section and a bypass path of this embodiment.
Figure 3:
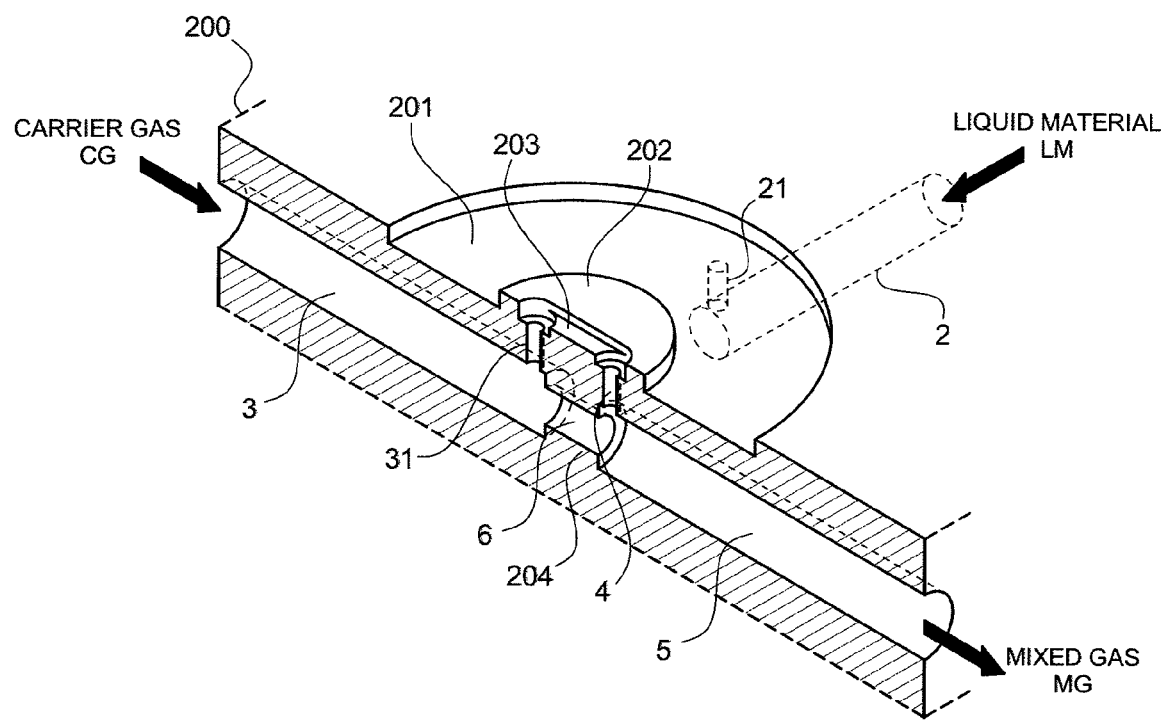
FIG. 3 is a perspective view showing an internal structure of a main body block in this embodiment.

A first embodiment of this invention will be explained with reference to the drawings. FIG. 1 is a longitudinal sectional view of a liquid material vaporization apparatus 100 in accordance with this embodiment, FIG. 2 is a partially enlarged cross-sectional view mainly showing a vaporization nozzle section 4 and a bypass path 6, and FIG. 3 is a cross-sectional perspective view showing an internal structure of a main body block 200.
<Configuration>
The liquid material vaporization apparatus 100 in accordance with this embodiment vaporizes various kinds of a liquid material LM used for manufacturing semiconductors in a control valve comprising a flow rate control mechanism.

Concretely, the liquid material vaporization apparatus 100 consists of, as shown in FIG. 1, a main body block 200 to which a liquid material supplying pipe to supply the liquid material LM, a carrier gas supply pipe to supply a carrier gas CG and a mixed gas derivation pipe to derive a mixed gas MG are connected, and a valve block 300 to control the carrier gas CG, the liquid material LM and the mixed gas MG flowing in the main body block 200, and comprises a gas-liquid mixing chamber 1 as being a gas-liquid mixing section, a liquid material introduction path 2, a carrier gas introduction path 3, a vaporization nozzle section 4, a mixed gas derivation path 5 and a bypass path 6.

Each section will be explained.

First, the main body block 200 and the valve block 300 will be explained. The main body block 200 is, as shown in FIG. 1, FIG. 2 and FIG. 3, for example, generally in a shape of a cuboid, and made of a material such as stainless steel having heat resistance and corrosion resistance. The liquid material introduction path 2, the carrier gas introduction path 3 and the vaporization nozzle section 4, the mixed gas derivation path 5 and the bypass path 6 are formed inside of the main body block 200. In addition, a concave section 201 forming the gas-liquid mixing chamber 1 is formed on an upper surface of the main body block 200 on which the valve block 300 is mounted. A code 8 in FIG. 1 is a heater to heat the whole main body block 200 at a predetermined temperature, and, for example, a cartridge heater can be used as the heater.

A vertical section 21 arranged in a downstream side of the liquid material introduction path 2 opens in the concave section 201, a valve sheet 202 a little higher than the concave section 201 is formed at a center part of the concave section 201, and a backflow prevention nozzle section 31 of the carrier gas introduction path 3 and a mixing groove 203 where the vaporization nozzle section 4 opens are formed on the valve sheet 202.

The valve block 300 functions as a control valve, and is arranged on an upper surface of the main body block 200 through a seal member 7 as shown in FIG. 1, and made of a material such as, for example, stainless steel having heat resistance and corrosion resistance. The valve block 300 comprises a diaphragm 301 that forms the gas-liquid mixing chamber 1 between the concave section 201 formed on the upper surface of the main body block 200 and the diaphragm 301 and an actuator 302 that presses the diaphragm 301 so as to transform the diaphragm 301.

The diaphragm 301 is made of a material superior in heat resistance and corrosion resistance and having appropriate elasticity, and comprises a valve section 301a that makes an abutting contact with or is separated from an upper surface of the valve sheet 202, a thin wall section 301b formed to surround the valve section 301a, a thick wall section 301c formed to surround the thin wall section 301b and fixed to the main body block 200, and an axis section 301d that transmits a pressing force from the actuator 302 to the valve section 301a. The valve section 301a is separated from the valve sheet 202 because the diaphragm 301 is urged upward by a spring on a constant basis, however, in case that a downward pressing force is applied to the valve section 301a by the axis section 301d, the valve section 301a moves toward a direction so that the valve section 301a makes an abutting contact with the valve sheet 202. As mentioned, a flow rate of the carrier gas CG, the liquid material LM and mixed gas MG can be controlled due to a positional relationship between the valve body 301a and the valve sheet 202.

The actuator 302 presses the diaphragm 301 downward so as to change its position, and is a piezoelectric actuator comprising a piezoelectric stack 302a consisting of laminated multiple piezoelectric elements in a housing 303 arranged at an upper part of the valve block 300 and a sphere 302b that is arranged between the piezoelectric stack 302a and the diaphragm 301 and that transmits the force of the piezoelectric stack 302a to the axis section 301d.

Next, the gas-liquid mixing chamber 1, the liquid material introduction path 2, the carrier gas introduction path 3, the vaporization nozzle section 4, the mixed gas derivation path 5 and the bypass path 6 will be explained. As shown in FIG. 1 and FIG. 2, the gas-liquid mixing chamber 1 is a space where the liquid material LM and the carrier gas CG are mixed. The gas-liquid mixing chamber 1 is formed by the diaphragm 301 of the valve block 300 and the concave section 201 of the upper surface of the main body block 200, and practically the space that functions as the gas-liquid mixing chamber 1 is a space formed by the mixing groove 203 of the concave section 201 and the diaphragm 301 (especially, refer to FIG. 2).

The liquid material introduction path 2 introduces the liquid material LM into the gas-liquid mixing chamber 1. The liquid material introduction path 2 is, as shown in FIG. 3, in a shape of a general "L" character with one end of the liquid material introduction path 2 opening at a side surface of the main body block 200 and the other end thereof opening at the gas-liquid mixing chamber 1 (the mixing groove 203) on the upper surface of the main body block 200.

The carrier gas introduction path 3 introduces the carrier gas CG into the gas-liquid mixing chamber 1. The carrier gas introduction path 3 is, as shown in FIG. 1 and FIG. 3, in a shape of a general "L" character with one end of the carrier gas introduction path 3 opening at a side surface (for example, a side surface other than a side surface where the opening of the liquid material introduction path 2 is arranged) of the main body block 200 and the other end thereof opening at the gas-liquid mixing chamber 1 located on the upper surface of the main body block 200. In addition, the backflow prevention nozzle section 31 is formed in a vertical section that opens at the gas-liquid mixing chamber 1 so that the carrier gas CG flowing into the gas-liquid mixing chamber 1 from the carrier gas introduction path 3 does not flow back again into the carrier gas introduction path 3.

The vaporization nozzle section 4 is, especially as shown in FIG. 2, arranged to be communicated with the gas-liquid mixing chamber (concretely, the mixing groove 203) and subjects a mixture comprising the liquid material LM and the carrier gas CG produced in the gas-liquid mixing chamber 1 to flash boiling. A diameter of the vaporization nozzle section 4 is considerably smaller than an inner diameter of the mixed gas derivation path 5 and, for example, smaller than or equal to 1.0 mm and a length of the vaporization nozzle section 4 is considerably short and about 1.0 mm.

The mixed gas derivation path 5 is arranged to communicate with the vaporization nozzle section 4 and derives the mixed gas MG vaporized by the vaporization nozzle section 4. As shown in FIG. 1 and FIG. 3, one end of the mixed gas derivation path 5 opens at a side surface (for example, a side surface other than a side surface where the opening of the liquid material introduction path 2 is arranged and a side surface where the opening of the carrier gas introduction path 3 is arranged) of the main body block 200 and the other end thereof is communicated with a downstream side of the vaporization nozzle section 4 that opens at an upstream side circumferential surface 5*b*. More concretely, the mixed gas derivation path 5 opens at the other end circumferential surface (the upstream side circumferential surface 5*b*) of the mixed gas derivation path 5 so as to be communicated with the vaporization nozzle section 4 (refer to FIG. 2). One end of the liquid material introduction path 2, one end of the carrier gas introduction path 3 and one end of the mixed gas derivation path 5 may open at the same side surface of the main body block 200.

As shown in FIG. 1 through FIG. 3, the carrier gas introduction path 3 and the mixed gas derivation path 5 are so formed that a flow channel direction of the carrier gas introduction path 3 and a flow channel direction of the mixed gas derivation path 5 are generally collinear. In addition, an inner diameter of the carrier gas introduction path 3 and an inner diameter of the mixed gas derivation path 5 are generally the same. The carrier gas introduction path 3 and the mixed gas derivation path 5 are separated through a bulkhead 204.

The bypass path 6 is communicated with the carrier gas introduction path 3 and the mixed gas derivation path 5 with one end of the bypass path 6 opening to the carrier gas introduction path 3 and the other end of the bypass path 6 opening to the mixed gas derivation path 5, as shown in FIG. 1 through FIG. 3, so as to flow the carrier gas CG from the carrier gas introduction path 3 to the mixed gas derivation path 5.

The bypass path 6 of this embodiment is arranged in the bulkhead 204, especially as shown in FIG. 2, and in a generally circular cylindrical shape with one end of the bypass path 6 opening at the downstream side end surface 3*a* of the carrier gas introduction path 3 and other end of the bypass path 6 opening at an upstream side end surface 5*a* of the mixed gas derivation path 5. A flow channel direction of the bypass path 6 is arranged to be generally collinear with the flow channel direction of the carrier gas introduction path 3 and the flow channel direction of the mixed gas derivation path 5. As mentioned, since each flow channel direction is generally the same, it is possible to make it easy to flow a part of the carrier gas CG in the carrier gas introduction path 3 into the bypass path 6.

In addition, an opening (an opening located at the upstream side end surface 5*a* of the mixed gas derivation path 5 in the bypass path 6) of the bypass path 6 in the mixed gas derivation path 5 is arranged near a downstream side opening of the vaporization nozzle section 4. In this embodiment, a flow of the mixture from the vaporization nozzle section 4 is set to collide with a flow of the carrier gas CG from the bypass path 6 generally at a right angle. With this arrangement, since the carrier CG flowing into the mixed gas derivation path 5 through the vaporization nozzle 4 directly collides with the mixture passing the vaporization nozzle 4, it is possible to grain-refine liquid droplets that are not grain-refined by the vaporization nozzle section 4, thereby improving a vaporization efficiency.

In accordance with the liquid material vaporization apparatus 100 having the above arrangement, the carrier gas CG passes the carrier gas introduction path 3 and then is divided into a route passing the backflow prevention nozzle section 31, the gas-liquid mixing chamber 1 and the vaporization nozzle section 4, and a route passing the bypass path 6.

At this time, when a differential pressure is 0.1 MPa, a flow rate of the carrier gas CG passing the vaporization nozzle 4 is about several LM (L/min), while a flow rate of the carrier gas CG passing the bypass path 6 is about several dozen LM.

Next, a relationship between the diameter of the bypass path 6 and the flow rate thereof will be explained with reference to FIG. 4. Under an ideal condition with a constant pressure, the gas flow rate passing a nozzle is proportional to a cross-section of the nozzle.

According to FIG. 4, assuming that a shape of the bypass path 6 is the same as that of the nozzle, in a case in which the flow rate at a time when the nozzle diameter is 0.2 [mm] is Q [SLM], it is possible for the liquid material vaporization apparatus 100 comprising the vaporization nozzle section 4 having a diameter of 0.4 [mm] and the bypass path 6 having a diameter of 1.0 [mm] to flow a flow rate of 4Q (a flow rate of the vaporization nozzle section 4)+25Q (a flow rate of the bypass path 6)=29Q. Namely, it is possible to flow a flow rate of seven times as much as a flow rate of 4Q without a bypass path 6. If a diameter of the bypass path 6 is increased, it is possible to further increase a flow rate of the carrier gas CG.

Effect of this Embodiment

In accordance with the liquid material vaporization apparatus 100 having the above arrangement, since not all of the carrier gas CG flowing through the carrier gas introduction path 3 passes the nozzle section 31, 4, but a part of the carrier gas CG passes the bypass path 6 and flows into the mixed gas derivation path 5, it is possible to increase a flow rate of the carrier gas CG. As a result, a partial pressure of the liquid material LM can be reduced so that a vaporized amount of the liquid material LM can be increased.

In addition, in case that the vaporization nozzle section 4 gets clogged by the mixture, since the carrier gas CG flows in the bypass path 6, it is possible to avoid a purge incapable state.

Second Embodiment

A liquid material vaporization apparatus 100 in accordance with a second embodiment of this invention will be explained with reference to the drawings. In the following explanation, the same numerical code is given to a component that is the same as or that corresponds to that of the liquid material vaporization apparatus 100 of the above-mentioned first embodiment. FIG. 5 is a longitudinal sectional view of the liquid material vaporization apparatus 100 in accordance with this embodiment, and FIG. 6 is a partial enlarged cross-sectional view mainly showing the vaporization nozzle section 4 and the bypass path 6.

A configuration of the bypass path 6 of the liquid material vaporization apparatus 100 in accordance with this embodiment is different from that of the liquid material vaporization apparatus 100 of the above-mentioned first embodiment.

As shown in FIG. 5 and FIG. 6, one end of the bypass path 6 opens at a downstream side circumferential surface 3*b* of the carrier gas introduction path 3 and the other end thereof opens at an upstream side circumferential surface 5b of the mixed gas derivation path 5.

More specifically, one end of the bypass path 6 is arranged at an opposite side of the backflow prevention nozzle section 31 in the downstream side circumferential surface 3b of the carrier gas introduction path 3 and the other end thereof is arranged at an opposite side of the vaporization nozzle section 4 in the upstream side circumferential surface 5b of the mixed gas derivation path 5.

Figure 5:
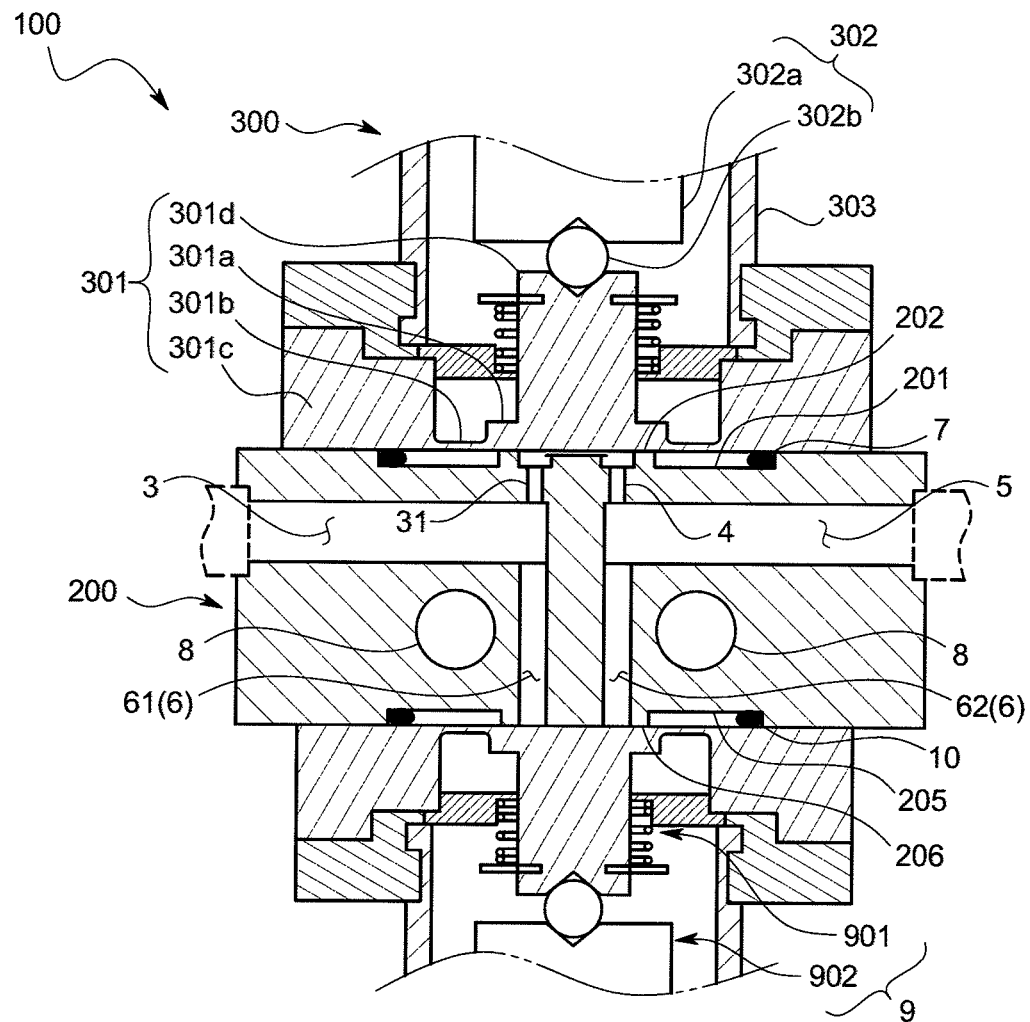
FIG. 5 is a cross-sectional view of a liquid material vaporization apparatus in accordance with a second embodiment of this invention.
Figure 6:
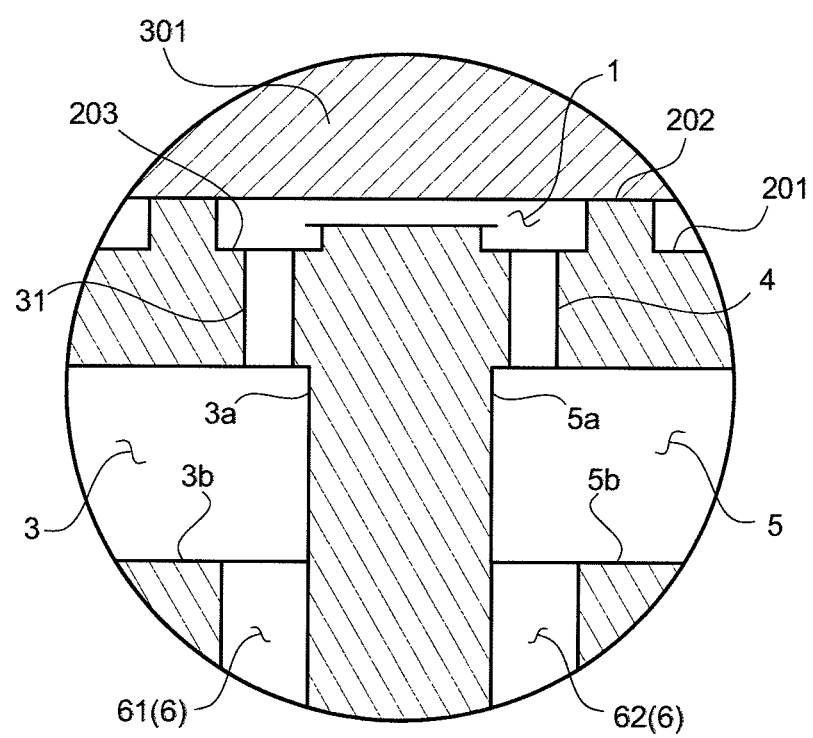
FIG. 6 is a partial enlarged cross-sectional view mainly showing a vaporization nozzle section and a bypass path of this embodiment.

The bypass path 6 of this embodiment comprises a first flow channel 61 and a second flow channel 62, and each flow channel 61, 62 opens at the concave section 205 arranged on the bottom surface of the main body block 200. Specifically, as shown in FIG. 5, the bypass path 6 is arranged at a center part of the concave section 205 and the first flow channel 61 and the second flow channel 62 open at a valve sheet 206 a little higher than the concave section 205.

A bypass path flow rate control section 9 that produces functions as an open close mechanism to open and close the bypass path 6 and a flow rate control mechanism to control the flow rate of the carrier gas CG flowing in the bypass path 6 is arranged in the bypass path 6.

The bypass path flow rate control section 9 is a control valve arranged through a seal member 10 on the bottom surface of the main body block 200, namely, on a surface, located at an opposite side to a surface where the valve block 300 is arranged, of the main body block 200. The configuration of the bypass path flow rate control section 9 is generally the same as that of the valve block 300 of the first embodiment, and comprises a diaphragm 901 that makes a back and forth movement relative to the valve sheet 206 of the concave section 205 formed on the bottom surface of the main body block 200 and an actuator 902 that presses the diaphragm 901 so as to transform the diaphragm 901.

The bypass path 6 is blocked (shut off) at a time when the diaphragm 901 makes an abutting contact with the valve sheet 206 by means of the actuator 902. Meanwhile, at a time when the diaphragm 901 is separated from the valve sheet 206 by means of the actuator 902, the bypass path 6 opens (passes through) and the carrier gas CG flows into the mixed gas derivation path 5. At this time, it is possible to adjust a flow rate of the carrier gas CG flowing in the bypass path 6 by changing a distance between the diaphragm 901 and the valve sheet 206.

More specifically, when the bypass path 6 is set in an open (OPEN) state by the bypass path flow rate control section 9, it is possible to divide the carrier gas CG into the bypass path 6. Meanwhile, when the bypass path 6 is set in a closed (CLOSE) state by the bypass path flow rate control section 9, similar to the conventional arrangement, it is possible to flow the carrier gas CG in only a route from the backflow prevention nozzle section 31 to the vaporization nozzle section 4 through the gas-liquid mixing chamber 1. In addition, it is possible to control the flow rate of the carrier gas CG flowing in the bypass path 6 by means of the bypass path flow rate control section 9 while the bypass path 6 is in the OPEN state.

Effect of the Second Embodiment

In accordance with the liquid material vaporization apparatus 100 having the above arrangement, since the flow rate of the carrier gas CG flowing in the bypass path 6 can be directly controlled in addition to the effect of the first embodiment, it is possible to control the flow rate of the carrier gas CG accurately according to various kinds of the liquid material LM, thereby improving the vaporization efficiency.

Other Modified Embodiment

The present claimed invention is not limited to the above-mentioned embodiment. In the following explanation, the same numerical code will be given to a component corresponding to the component of the above-mentioned embodiment.

For example, in the first embodiment, the carrier gas introduction path 3 may not comprise the backflow prevention nozzle section 31.

In addition, each shape of the carrier gas introduction path 3, the mixed gas derivation path 5, the liquid material introduction path 2 and the bypass path 6 is not limited to each of the above-mentioned embodiments, and may be changed appropriately.

Furthermore, in the above-mentioned embodiment, since the backflow prevention nozzle section 31 and the vaporization nozzle section 4 are of the same size, it is possible to use the carrier gas introduction path 3 as the mixed gas derivation path 5 and the mixed gas derivation path 5 as the carrier gas introduction path 3, thereby increasing a degree of freedom in piping of the liquid material vaporization apparatus 100.

In addition, a number of the bypass path 6 is not limited to one, and may be multiple.

The open close mechanism to open and close the bypass path 6 and the flow rate control mechanism to control the flow rate in the bypass path 6 are composed of one bypass path flow rate control section in the above-mentioned second embodiment, however, the open close mechanism and the flow rate control mechanism may be separately arranged or either one of them may be arranged.

Figure 7:
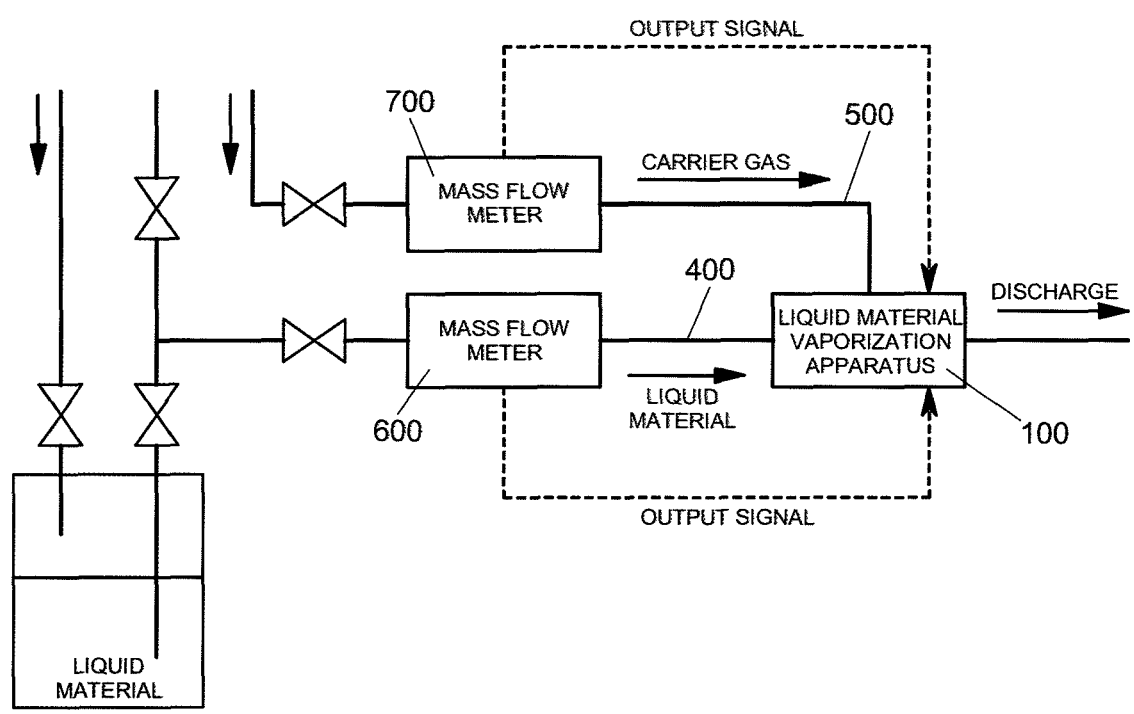
FIG. 7 is a general view of a liquid material vaporization apparatus in accordance with a modified embodiment of this invention.

In addition, a liquid material vaporization system shown in FIG. 7 may comprise the liquid material vaporization apparatus 100 of the second embodiment. The liquid material vaporization system comprises the liquid material vaporization apparatus 100 having the flow rate control mechanism (the bypass path flow rate control section 9) to control the flow rate of the carrier gas CG in the bypass path 6, a liquid material supply pipe 400 to supply the liquid material LM to the liquid material vaporization apparatus 100, a carrier gas supply pipe 500 to supply the carrier gas CG to the liquid material vaporization apparatus 100, and mass flow meters 600, 700, each of which is arranged in the liquid material supply pipe 400 and the carrier gas supply pipe 500 respectively. With this arrangement, the flow rate of the carrier gas CG flowing in the bypass path 6 is adjusted by feedback-controlling the bypass path flow rate control section 9 based on an output signal from the mass flow meter 700 arranged in the carrier gas supply pipe 500. In addition, the flow rate of the liquid material LM flowing into the vaporization nozzle section 4 is adjusted by feedback-controlling the valve block 300 based on an output signal from the mass flow meter 600 arranged in the liquid material supply pipe 400.

Furthermore, the above-mentioned mass flow meter 600, 700 may be of a thermal type or of a differential pressure type. It is possible for either of the thermal type and the differential pressure type flow meter to produce the same effect.

In addition, it is a matter of course that the liquid material vaporization apparatus of the above-mentioned embodiment can be used for not only a semiconductor manufacturing process but also a general use such as vaporizing the liquid material used in other than the semiconductor manufacturing process.

In addition, a part or all of the above-mentioned embodiment or the modified embodiment may be appropriately combined, and it is a matter of course that the present claimed invention is not limited to the above-mentioned embodiment and may be variously modified without departing from a spirit of the invention.

POSSIBLE APPLICATIONS IN INDUSTRY

With the present claimed invention, it is possible for the liquid material vaporization apparatus to enlarge a flow rate of the carrier gas without changing a shape of a nozzle.

The invention claimed is:

1. A liquid material vaporization apparatus comprising:
    a gas-liquid mixing section in which a liquid material and a carrier gas are mixed,
    a liquid material introduction path to introduce the liquid material into the gas-liquid mixing section,
    a carrier gas introduction path to introduce the carrier gas into the gas-liquid mixing section,
    a vaporization nozzle section that is communicated with the gas-liquid mixing section to subject a mixture of the liquid material and the carrier gas to flash boiling,
    a mixed gas derivation path that is communicated with the vaporization nozzle section to derive mixed gas vaporized by the vaporization nozzle section, and
    a bypass path through which the carrier gas introduction path is communicated with the mixed gas derivation path on a downstream side of the vaporization nozzle section to flow the carrier gas from the carrier gas introduction path to the mixed gas derivation path.

2. The liquid material vaporization apparatus described in claim 1, wherein
    an opening of the bypass path in the mixed gas derivation path is arranged near the downstream side opening of the vaporization nozzle section.

3. The liquid material vaporization apparatus described in claim 1, wherein
    an open and close mechanism that opens and closes the bypass path is provided.

4. The liquid material vaporization apparatus described in claim 1, wherein
    a flow rate control mechanism that controls a flow rate of the carrier gas flowing in the bypass path is provided.

* * * * *